(12) United States Patent
Rivoir

(10) Patent No.: US 9,103,887 B2
(45) Date of Patent: Aug. 11, 2015

(54) METHOD AND APPARATUS FOR ADJUSTING TRANSITIONS IN A BIT STREAM

(75) Inventor: Jochen Rivoir, Magstadt (DE)

(73) Assignee: ADVANTEST CORPORATION, Tokyo (JP)

( * ) Notice: Subject to any disclaimer, the term of this patent is extended or adjusted under 35 U.S.C. 154(b) by 1415 days.

(21) Appl. No.: 10/446,568

(22) Filed: May 28, 2003

(65) Prior Publication Data
US 2004/0057541 A1    Mar. 25, 2004

(30) Foreign Application Priority Data
Sep. 24, 2002   (EP) .................................. 02021145

(51) Int. Cl.
*H04L 7/00*      (2006.01)
*G01R 31/3193*   (2006.01)

(52) U.S. Cl.
CPC ................................ *G01R 31/31937* (2013.01)

(58) Field of Classification Search
USPC .................. 375/342, 371, 355, 354
See application file for complete search history.

(56) References Cited

U.S. PATENT DOCUMENTS

| 5,272,729 A * | 12/1993 | Bechade et al. | 375/371 |
| 5,436,937 A * | 7/1995 | Brown et al. | 375/376 |
| 6,993,695 B2 * | 1/2006 | Rivoir | 714/734 |
| 2003/0208717 A1 * | 11/2003 | Klotchkov et al. | 714/814 |

FOREIGN PATENT DOCUMENTS

| JP | 62-269410 | 11/1987 |
| JP | 63-031212 | 2/1988 |
| JP | 64-067029 | 3/1989 |
| JP | 02-141117 | 5/1990 |

OTHER PUBLICATIONS

Chinese Office Action; Date Aug. 4, 2006, from corresponding Application No. 03149595.8.

* cited by examiner

*Primary Examiner* — Shuwang Liu
*Assistant Examiner* — Nader Bolourchi

(57) ABSTRACT

The present invention relates to a method for adjusting transitions in a bit stream of a signal to be evaluated by comparison with a predetermined expected bit stream, comprising the steps of receiving said bit stream signal by a transition adjustment filter, providing a transition frame signal to said transition adjustment filter, said transition frame signal providing information for eliminating non-deterministic clock latencies within said bit stream of said received signal, and adjusting said bit stream of said received signal according to said transition frame signal resulting in an adjusted bit stream being in alignment to said expected bit stream.

3 Claims, 6 Drawing Sheets

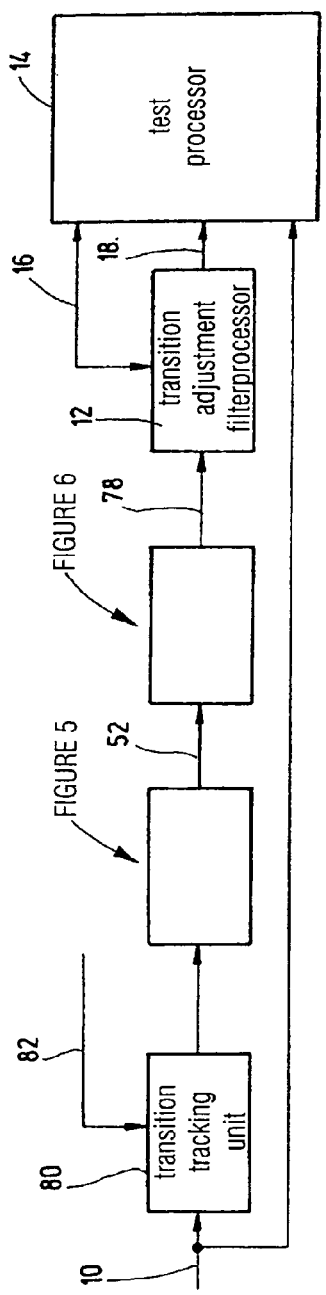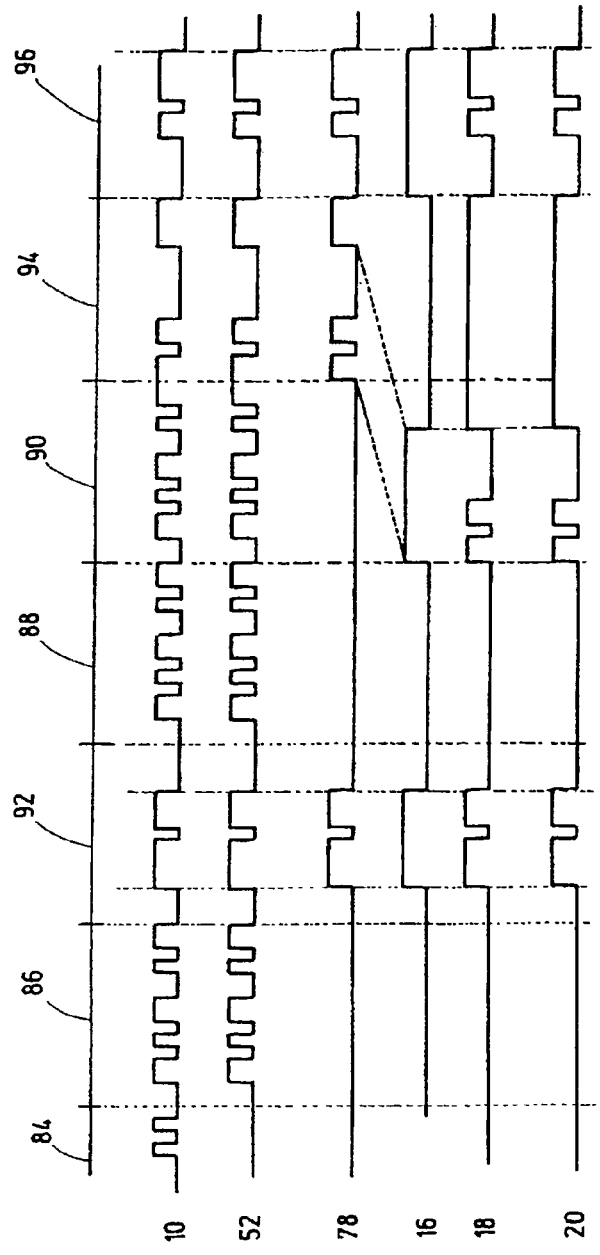

METHOD AND APPARATUS FOR ADJUSTING TRANSITIONS IN A BIT STREAM

BACKGROUND OF THE INVENTION

The present invention relates to the adjustment of transitions within a bit stream, in particular for adjustment of transitions within a bit stream on an output signal of an electronic device to be tested.

For testing electronic devices, in particular integrated electronic circuits providing digital electrical output signals, a test or stimulus signal is fed to an input of the device under test, in the following abbreviated as DUT, and a response signal of the DUT is evaluated by an automatic test equipment, in the following abbreviated as ATE, for example by comparison with expected data.

The output signals of modern integrated electronic circuits often exhibit non-deterministic clock latencies between activities even if they are stimulated with the same stimuli. During production test of those devices, prior art test equipment expects to do a bit level comparison against a fix precomputed stream of expected bits. In the presence of non-deterministic behavior these tests will fail, even though the DUT is operating correctly.

The reasons for non-deterministic output timing are beyond others process variations causing unknown but static timing variations, temperature variations of the clock insertion delays causing unknown and time varying timing drift, initial random bits after reset or start-time latencies, on-chip or inter-chip signal cross clock-domains resulting in non-deterministic idle time, in particular with non-trivial fractional ratios, and jitter causing unknown and non-deterministic timing variations.

SUMMARY OF THE INVENTION

It is an object of the invention to improve testing of electronic devices.

The object is solved as defined by the independent claims. Preferred embodiments are defined by the dependent claims.

The present invention uses knowledge about the possible time locations of non-deterministic latencies and filters the DUT output signal such that the non-deterministic latencies are removed before evaluation of the bit stream by comparison with the expected bit stream is conducted.

According to the present invention, information is provided about the possible time location of non-deterministic latencies in the form of a signal, in particular a hardware signal, called Transition Frame. In a preferred embodiment, when Transition Frame is low, a non-deterministic latency can be tolerated. Accordingly, when Transition Frame is high, no stretching is allowed, i.e. every bit must appear as expected, like in traditional test equipment.

The transition adjustment block acts as a filter and uses the information provided by the Transition Frame signal and moves blocks of bits from the device output such that they match the expected bit stream, preferably in a vector memory. The Transition Frame comprises information about the length and the expected alignment of bit segments. The Transition Frame preferably frames a bit segment from a first transition to a last transition plus a number of trailing bits in the same bit segment and/or an umber of leading bits in a following bit segment. The Transition Frame can be offset from the simulated timing, if placement resolution is a limitation.

In other words, according to the invention, adjustment is based on an intelligent pattern matching algorithm that compares the DUT bit stream with the expected bit stream and uses a framing information to readjust bit segments of the DUT bit stream so that they align with the expected bit stream. The received DUT bit stream is segment wise pattern matched with the expected bit segments as indicated by an expected bit stream and the framing information. The bit segments in the DUT bit stream identified by the pattern match are brought into alignment with the expected bit stream and the aligned bit stream is compared with the expected bit stream.

A possible hardware implementation of the present invention can comprise First-In-First-Out (FIFO) shift registers and/or binary digital elements, e.g. J/K-flip-flop, AND-elements etc. Signal transitions are detected and for the adjusted bits the previous value is repeated as long as the Transition Frame signal is on a predetermined value, e.g. LOW.

The information to generate the Transition Frame signal can be embedded into the expected waveform by adding a new event type WAIT, which informs the test equipment to wait for the next transition. The new event type WAIT allows to tolerate drifts or phase jumps between transitions, non-deterministic start time, and non-deterministic spacing between transitions. The new event type WAIT sets the Transition Frame signal to LOW.

A simulation of the DUT that makes use of DUT internal protocol information can automatically place WAIT events into the expected waveform. E.g. WAIT events can be placed at transaction/packet boundaries to indicate tolerable non-deterministic latencies between transactions/packets.

A preferred embodiment of the present invention can tolerate initial random activities by start-up suppression of initial random bits, occurring for example following a start-up. Such random bits can be replaced with a predetermined value, e.g. LOW. This start-up suppression can serve as a Start Pattern Synchronization. The bit stream from the DUT can be stored in a history shift register and will be passed on as a result of a comparison of the bits stored in the history shift register with a start pattern mask. The startup suppression can be implemented as part of the ATE, on the DUT interface board or inside the DUT.

A preferred embodiment of the present invention can tolerate non-deterministic idle packets between valid payload patterns for the purpose to suppress all activities caused by "idle packets" and thus the transition adjustment filter receives only valid payload bit packets. Preferably the last bit before an idle packet is stretched, e.g. by repeating, over the duration of the idle packet. The idle suppression can be implemented as part of the ATE, on the DUT interface board or inside the DUT.

If only non-deterministic start-up latencies have to be tolerated, the transition frame can be derived from a simple counter.

According to preferred embodiments of the present invention, the transition adjustment is generic and in particular independent from any data protocol. Implementation can be performed very effective as being possible all-digital. The comparison of the adjusted bit stream can be based on pre-stored pattern. According to preferred embodiments of the present invention, the per-pin-architecture allows integration resulting in high reliability, high performance and cost-efficiency.

According to a preferred embodiment, the invention is partly or entirely implemented in hardware. The invention can alternatively or in addition be partly or entirely embodied or supported by one or more suitable software programs, which can be stored on or otherwise provided by any kind of data carrier, and which might be executed in or by any suitable data processing unit. Software programs or routines are preferably applied in the ATE which can be realized by hardware and/or software alone or by a combination of hardware and software. The hardware can partially or in whole be implemented in the DUT or on the DUT interface board and inside the ATE.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference signs.

FIG. 8 shows an overview of the preferred embodiment of the present invention, and FIG. 9 shows the signal diagrams according to the configuration shown in FIG. 8.

DETAILED DESCRIPTION OF EMBODIMENTS OF THE INVENTION

Figure 1:
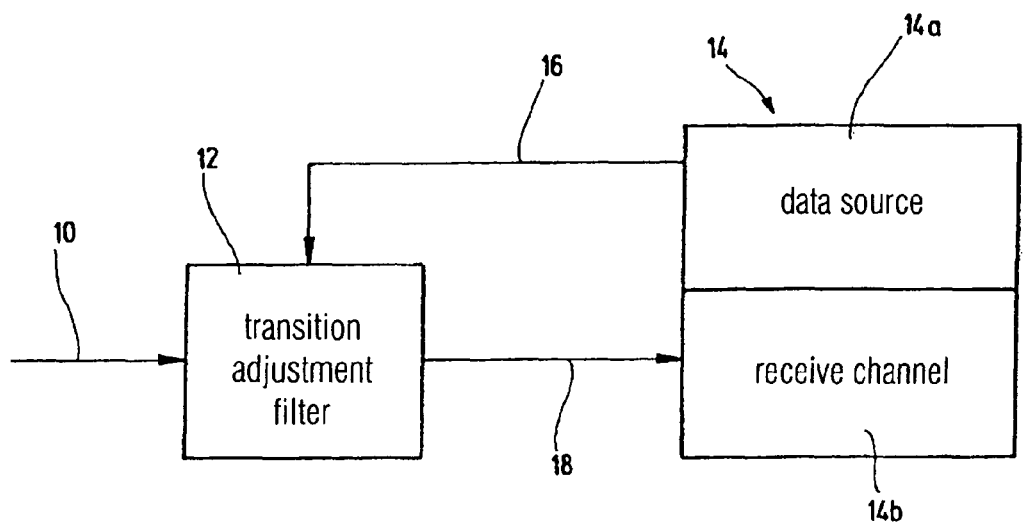
FIG. 1 shows in schematic form an overview of the present invention.

FIG. 1 shows in schematic form an overview of the present invention. A bit stream 10 is received from a DUT, for example an integrated electronic circuit, by a transition adjustment filter 12. From a test processor 14 a transition frame signal 16 is provided to said transition adjustment filter 12. More specifically, the transition frame signal 16 is driven by a data source 14a of the test processor 14. The transition frame signal 16 provide information for eliminating non-deterministic clock latencies within said bit stream 10 of said received signal. The bit stream 10 is adjusted within the transition adjustment filter 12 according to said transition frame signal 16 resulting in an adjusted bit stream 18 being in alignment to an expected bit stream 20 shown in FIG. 2. More specifically, a receive channel 14b of the test processor 14 compares the adjusted bit stream 18 as an input signal to the precomputed expected bit stream 20. The data source 14a and/or the receive channel 14b can be realized as a conventional ATE channel, one drive channel and/or one receive channel.

The expected bit stream 20 depends from an input signal provided to the DUT. Usually, such input signal, the expected bit stream 20 and/or the transition frame signal 16 are provided by the designer or manufacturer of the electronic device, the output signal of which has to be evaluated using the inventive method for adjusting transitions. Alternatively, a simulation of the DUT that has access to DUT internal protocol information can generate the necessary information to create the Transition Frame signal.

In a preferred embodiment, evaluation of the bit stream 10 of the adjusted bit stream 18 is performed within the test processor 14. Accordingly, usually the expected bit stream 20 is stored within the test processor 14.

Figure 2:
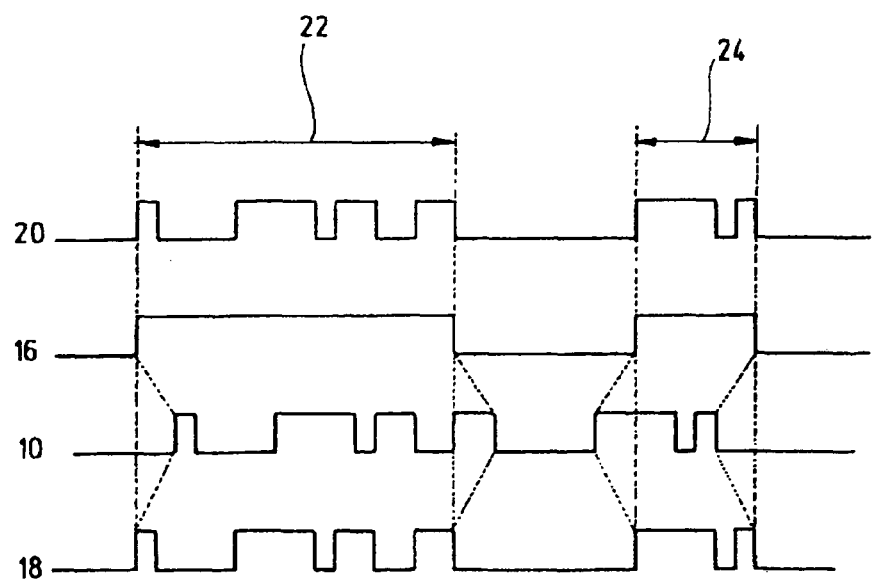
FIG. 2 shows signal diagrams according to the present invention.

FIG. 2 shows signal diagrams according to the present invention. In the uppermost line the expected bit stream 20 is shown. First and second bit segments 22, 24 are separated by a pause. The transition frame signal 16 represents the validity of information between the first and the last signal transition within each bit segment 22, 24. As can be seen from the received bit stream 10, there is a non-deterministic and non-constant latency in the received bit stream 10. The frame signal 16 is used to adjust received bit stream 10 into a adjusted bit stream 18. Following such adjustment, the adjusted bit stream 18 can easily be compared with the expected bit stream 20.

Figure 3:
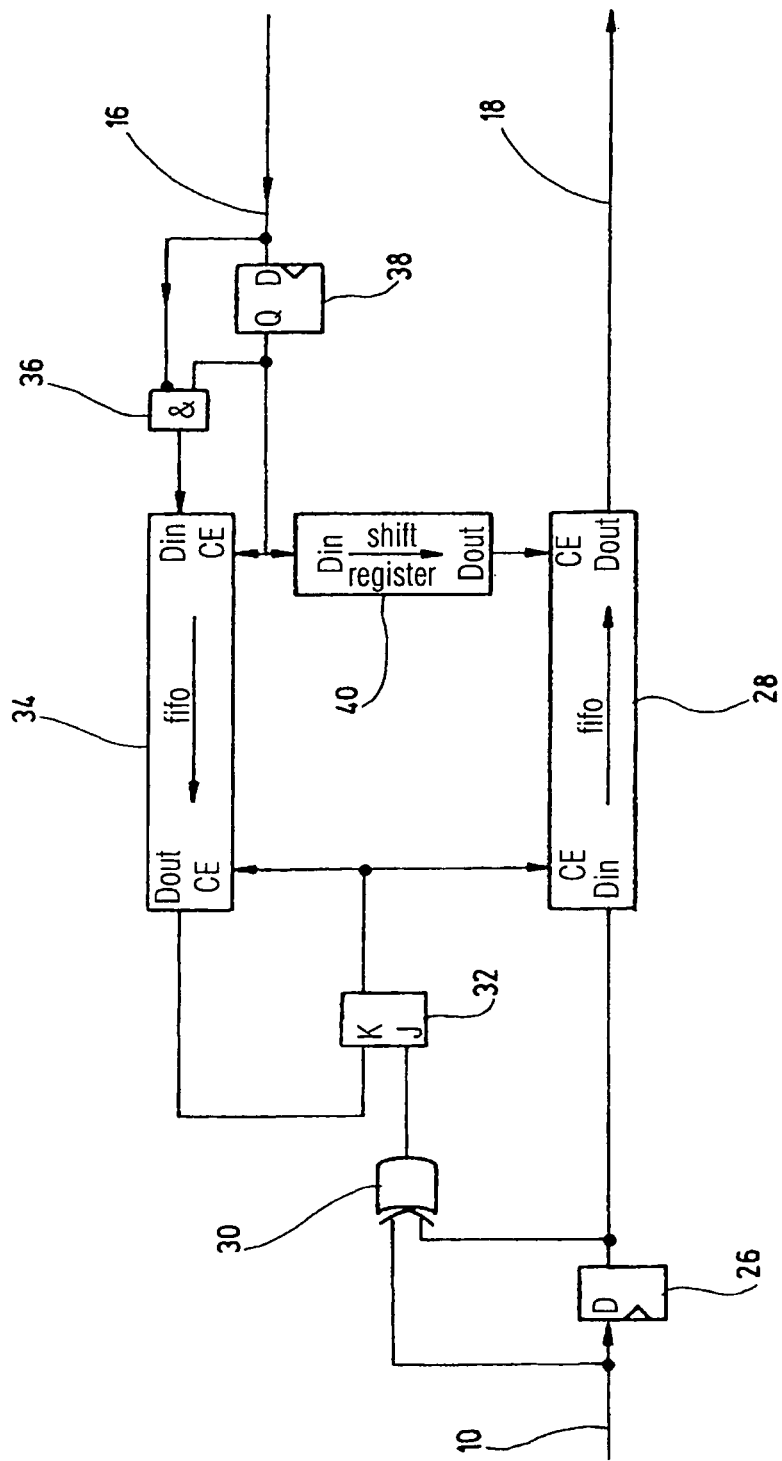
FIG. 3 shows one possible design concept for the transition adjustment filter according to the present invention.

FIG. 3 shows one possible design concept for the transition adjustment filter according to the present invention. The received bit stream from the DUT is provided to a first delay element 26 (D-type flip-flop), the output of which is provided to a first bit stream FIFO 28 as well as to an EXCLUSIVE-OR (EXOR) element 30 to which also the received bit stream 10 is inputted. Accordingly the output of the EXOR element 30 is HIGH only, if a transition occurs within the bit stream 10.

The output of the EXOR element 30 is inputted to a J/K-type flip-flop 32, the output of which is provided to the first FIFO 28 as a CLOCK ENABLE for DATA IN as well as to a second FIFO 34 as CLOCK ENABLE for DATO OUT. The second FIFO 34 receives an input from an AND element 36, which itself is inputted by the inverted transition frame signal 16 and the transition frame signal 16 delayed by a second delay element 38 (D-type flip-flop). Accordingly the output of the AND element 36 which is connected to the data input of the second FIFO 34 is HIGH only, when the transition frame signal is LOW subsequent to a HIGH.

On the other hand, the output of the second delay element 38 is used as CLOCK ENABLE input for DATA IN of the second FIFO 34 as well as for DATA IN of a shift register 40. The output of the shift register 40 is used as CLOCK ENABLE for DATA OUT of the first FIFO 28.

Accordingly, second FIFO 34 contains bit value HIGH for last clock when the transition frame signal 16 is HIGH, and LOW for other clocks when transition frame signal 16 is HIGH. No entry is made when transition frame signal 16 is LOW.

First FIFO 28 contains only bits that belong to a transition frame signal 16, starting with the first transition in the bit stream 10 of the DUT. While transition frame signal 16 is LOW, the previous value is repeated, i.e., the gap to the most recent transition is stretched.

Figure 4:
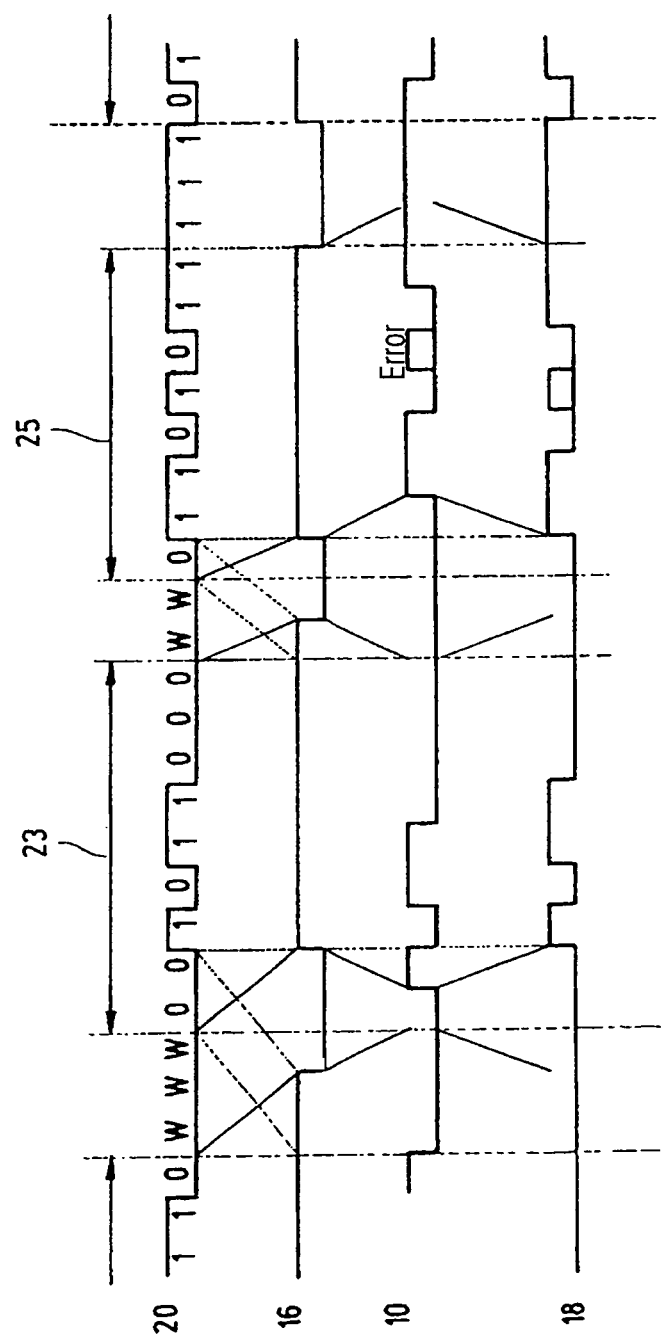
FIG. 4 shows the signal diagram for the design in FIG. 3.

FIG. 4 shows the signal diagram for the design in FIG. 3. In the uppermost line the expected bit stream signal 20 and below the transition frame signal 16 are shown. The information provided by said transition frame signal 16 are embedded into said expected bit stream 20 by adding bits of a new event type WAIT W. As can be seen, the received bit stream 10 is not in alignment with the expected bit stream 20. According to the present invention, the received bit stream 10 is adjusted resulting in the adjusted bit stream 18 being in alignment with the expected bit stream 20 and thus allowing easy comparison with the expected bit stream 20.

The transition frame signal 16 frames the time from the first transition of a transaction 23 to the last transition of same transaction 23 plus number of non-transition trailing bits in same transaction 23 and plus number of leading non-transition bits of a following transaction 25, or in other words, the time from the first transition of a transaction 23 to the last bit of same transaction 23 plus the leading non-transition bits of a following transaction 25.

Figure 5:
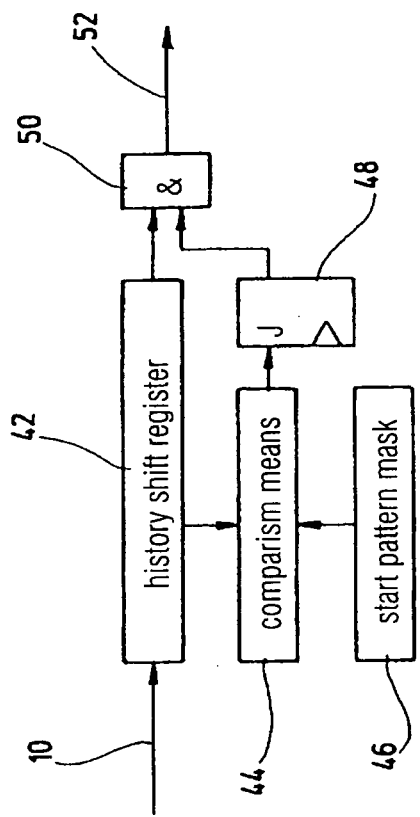
FIG. 5 shows the start-up suppression according to a preferred embodiment of the invention.

FIG. 5 shows the start-up suppression according to a preferred embodiment of the invention. The bit stream 10 is inputted into a first history shift register 42. The content of the first history shift register 42 is compared by a first comparison means 44 with a start pattern mask 46. The output of the first comparison means 44 is inputted to a JK-type flip-flop 48. The output of which is inputted together with the output of the first history shift register 42 to a second AND element 50. At the output of the second AND element 50 an output signal 52 is provided, in which initial random bits, for example after a reset, are eliminated. As shown in FIG. 9, left portion, described below, the output signal 52 is kept to LOW until the start-up pattern has been recognized. From that time on, the bit stream is propagated in an unchanged way to the output.

Figure 6:
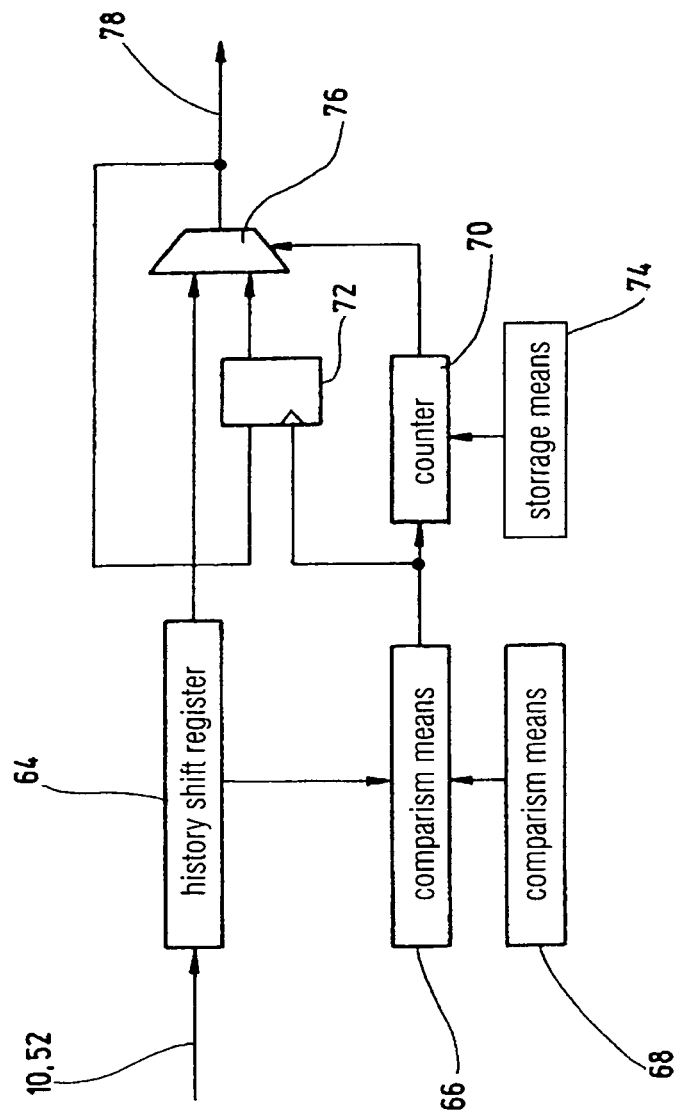
FIG. 6 shows the idle packet suppression according to a preferred embodiment of the invention.

FIG. 6 shows a design to provide idle packet suppression. As input for the second history shift register 64 the bit stream 10 of the DUT can be used or the output signal 52 of the start-up suppression design according to FIG. 5. The content of the second history shift register 64 is inputted to a second comparison means 66 as well as the content of an idle pattern mask 68. The output of the second comparison means 66 is inputted to a counter 70 as well as to a D-type flip-flop 72. Furthermore the counter 70 receives input from a length storage means 74 providing the lengths of the idle packet. The output of the flip-flop 72 is inputted to a binary element 76, receiving also the output of the counter 70 and the output of the second history shift register 64. The output of binary element 76 is provided as idle packet suppressed output signal 78, which is fed-back to the flip-flop 72.

Figure 7:
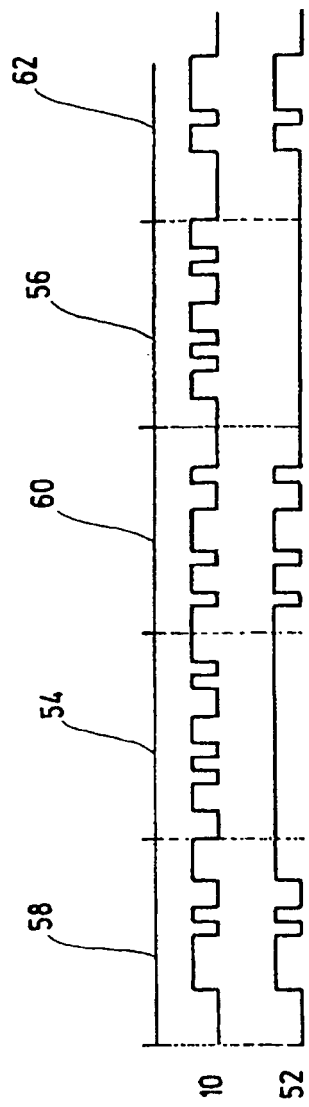
FIG. 7 shows the signal diagrams according to the design in FIG. 6.

FIG. 7 shows the signal diagrams according to the design shown in FIG. 6. As can be seen, the signal transition during first and second idle segments 54, 56 are eliminated in the output signal 52 and only the valid bit segments or payload 58, 60 and 62 are represented by corresponding signal transitions in the output signal 52.

FIG. 8 shows an overview of the preferred embodiment of the present invention wherein the received signal 10 from the DUT is inputted in a transition tracking unit 80 which is not further disclosed within this application and which receives over-sampling clocks 82. The output of the transition tracking unit 80 is inputted to the start-up suppression design shown in FIG. 5, providing an output signal 52 which is inputted to the idle packet suppression design shown in FIG. 6. The resulting idle packet suppressed output signal 78 is finally inputted to the transition adjustment filter 12 shown in FIG. 1.

FIG. 9 shows the signal diagrams according to the configuration shown in FIG. 8. The bit stream 10 received from the DUT comprises initial random bits 84 as well as idle packet 86, 88, 90 and valid (payload) bit segments 92, 94, 96. Within the output signal 52 of the start-up suppression design according to FIG. 5, the initial random bits 84 are eliminated. In the idle packet suppressed output signal 78 outputted by the idle packet suppression unit according to FIG. 6, the corresponding idle packet 86, 88, 90 are suppressed. The remaining bits in the output signal 78 are adjusted according to the transition frame signal 16 so as to result in adjusted bit stream 18 being in alignment with the expected bit stream 20 and thus allowing easy comparison with the expected bit stream 20.

The invention claimed is:

1. A method for adjusting transitions in a bit stream of a signal to be evaluated by comparison with a predetermined expected bit stream, comprising the steps of:
   receiving said bit stream by a transition adjustment filter,
   providing a transition frame signal to said transition adjustment filter, said transition frame signal providing information for eliminating non-deterministic clock latencies within said bit stream of said received signal, and
   adjusting said bit stream of said received signal according to said transition frame signal resulting in an adjusted bit stream being in alignment to the predetermined expected bit stream,
   wherein said information provided by said transition frame signal is embedded into the predetermined expected bit stream by adding an event type WAIT, said event type WAIT indicating to wait for the next signal transition for evaluating by comparison with the predetermined expected bit stream.

2. A method for adjusting transitions in a bit stream of a signal to be evaluated by comparison with a predetermined expected bit stream, comprising the steps of:
   receiving said bit stream by a transition adjustment filter,
   providing a transition frame signal to said transition adjustment filter, said transition frame signal providing information for eliminating non-deterministic clock latencies within said bit stream of said received signal, and
   adjusting said bit stream of said received signal according to said transition frame signal resulting in an adjusted bit stream being in alignment to the predetermined expected bit stream,
   wherein initial non-valid random bits in said bit stream of said signal to be evaluated are suppressed before said signal is received by said transition adjustment filter.

3. A method for adjusting transitions in a bit stream of a signal to be evaluated by comparison with a predetermined expected bit stream, comprising the steps of:
   receiving said bit stream by a transition adjustment filter,
   providing a transition frame signal to said transition adjustment filter, said transition frame signal providing information for eliminating non-deterministic clock latencies within said bit stream of said received signal, and
   adjusting said bit stream of said received signal according to said transition frame signal resulting in an adjusted bit stream being in alignment to the predetermined expected bit stream,
   wherein idle bit packets in said bit stream of said signal to be evaluated are suppressed before said signal is received by said transition adjustment filter.

* * * * *